United States Patent
Shaaban et al.

(10) Patent No.: US 12,306,249 B2
(45) Date of Patent: May 20, 2025

(54) SAVING AND RESTORING SCAN STATES

(71) Applicant: Atmosic Technologies, Inc., Campbell, CA (US)

(72) Inventors: Mohsen Shaaban, San Jose, CA (US); Steven Stoiber, Saratoga, CA (US)

(73) Assignee: Atmosic Technologies, Inc., Campbell, CA (US)

( * ) Notice: Subject to any disclaimer, the term of this patent is extended or adjusted under 35 U.S.C. 154(b) by 0 days.

(21) Appl. No.: 18/406,067

(22) Filed: Jan. 5, 2024

(65) Prior Publication Data

US 2024/0230758 A1 Jul. 11, 2024

Related U.S. Application Data

(60) Provisional application No. 63/478,693, filed on Jan. 5, 2023.

(51) Int. Cl.
| | |
|---|---|
| *G01R 31/3185* | (2006.01) |
| *G01R 31/302* | (2006.01) |
| *G06F 1/3209* | (2019.01) |
| *G06F 1/3234* | (2019.01) |
| *G06F 1/3287* | (2019.01) |
| *G06F 9/4401* | (2018.01) |
| *H04W 52/02* | (2009.01) |

(52) U.S. Cl.
CPC . *G01R 31/318536* (2013.01); *G01R 31/3025* (2013.01); *G01R 31/318572* (2013.01); *G06F 1/3209* (2013.01); *G06F 1/3275* (2013.01); *G06F 1/3287* (2013.01); *G06F 9/4418* (2013.01); *H04W 52/0251* (2013.01); *H04W 52/028* (2013.01)

(58) Field of Classification Search
CPC ........ G01R 31/318536; G01R 31/3025; G01R 31/318572; G06F 1/3209; G06F 1/3275; G06F 1/3287; G06F 9/4418; H04W 52/0251; H04W 52/028
USPC .................................................. 714/727, 718
See application file for complete search history.

(56) References Cited

U.S. PATENT DOCUMENTS

| | | | |
|---|---|---|---|
| 5,596,585 A | 1/1997 | Njinda et al. | |
| 7,191,372 B1 | 3/2007 | Jacobson et al. | |
| 7,295,036 B1 * | 11/2007 | Zaveri ............. | H03K 19/17784 |
| | | | 326/26 |
| 7,313,730 B1 | 12/2007 | Ryser | |
| 7,685,380 B1 | 3/2010 | Khu | |
| 7,844,867 B1 | 11/2010 | Reddy et al. | |

(Continued)

*Primary Examiner* — John J Tabone, Jr.
(74) *Attorney, Agent, or Firm* — Paradice & Li LLP

(57) ABSTRACT

A wireless device that can save and restore state information is disclosed. The wireless device stores state information in non-persistent registers during an active power state, routes the state information from the non-persistent registers to a non-volatile memory, via a boundary scan chain using one or more test signals, based on an indication that the wireless device is to enter a low-power state, and enters the low-power state after the state information is stored in the non-volatile memory. The wireless device may remove power from the processor, the non-persistent registers, the non-volatile memory, and one or more other portions of the wireless device during the low-power state. The wireless device may return to the active power state after a period of time and restore the state information to the non-persistent registers upon returning to the active power state.

20 Claims, 6 Drawing Sheets

(56) References Cited

U.S. PATENT DOCUMENTS

| | | |
|---|---|---|
| 7,916,510 B1 | 3/2011 | Starovoitov et al. |
| 10,969,433 B1 | 4/2021 | Nerukonda et al. |
| 11,199,582 B2 | 12/2021 | Flateau, Jr. et al. |
| 11,237,910 B2* | 2/2022 | Stoiber .................. G06F 3/068 |
| 2016/0284323 A1* | 9/2016 | Neugebauer .......... G06F 3/1415 |
| 2020/0073757 A1* | 3/2020 | Stoiber ............... G06F 11/3058 |
| 2024/0230758 A1* | 7/2024 | Shaaban ........... H04W 52/0251 |

* cited by examiner

SAVING AND RESTORING SCAN STATES

CROSS-REFERENCE TO RELATED APPLICATION

This Patent Application claims priority to U.S. Provisional Patent Application No. 63/478,693 entitled "SAVING AND RESTORING SCAN STATES" and filed on Jan. 5, 2023, which is assigned to the assignee hereof. The disclosure of the prior provisional patent application is considered part of and is incorporated by reference in this Patent Application.

TECHNICAL FIELD

The present implementations relate generally to wireless devices, and specifically to saving and restoring state information associated with wireless devices.

BACKGROUND OF RELATED ART

Wireless devices (such as Wi-Fi devices, Bluetooth devices, wireless sensors, and IoT devices, among other examples) are battery powered to provide mobility and convenience. Reducing the power consumption of wireless devices may increase the time between battery charging and extend battery life. These wireless devices typically use a low-power state to conserve power when not actively transmitting, receiving, or processing data. For example, a wireless device may leave an active power state and enter a low-power state during which the wireless device's processor and associated with circuitry are placed in a sleep state or hibernation and a reduced supply voltage (or no supply voltage) is provided various components of the wireless device to minimize power consumption. State information retrieved from registers associated with the processor is stored in non-volatile retention registers before the wireless device enters the low-power state, for example, so that an operational state of the wireless device can be preserved during the low-power state. When the wireless device exits the low-power state and returns to the active power state, the state information is read from the non-volatile retention registers and restored to processor's registers, thereby allowing the wireless device to return to its previous operational state.

Although non-volatile retention registers can preserve state information during the low-power state, these non-volatile retention registers occupy a relatively large amount of circuit area and may consume an undesirable amount of power. Moreover, due to the size and cost of these non-volatile retention registers, only a portion of the wireless device's state information is typically saved during the low-power state, and therefore at least some of the state information may be lost during the low-power state. As such, there is a need to reduce the size and power consumption of non-volatile memory elements that can store state information during the low-power state.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects.

One innovative aspect of the subject matter described in this disclosure can be implemented as a method of saving and restoring state information of a wireless device. In some implementations, the method includes storing state information in non-persistent registers of the wireless device during an active power state, where the state information is associated with operations performed by a processor of the wireless device. The method also includes routing, via a boundary scan chain using one or more test signals, the state information from the non-persistent registers to a non-volatile memory based on an indication that the wireless device is to enter a low-power state, and entering the low-power state after the state information is stored in the non-volatile memory.

In some instances, the non-volatile memory is a Static Random Access Memory (SRAM), and the method may also include configuring at least a portion of the SRAM as a cache memory for the processor during the active power state. In some aspects, the state information includes all data stored in each general-purpose register and each architectural register associated with the processor. In other aspects, the state information includes configuration data identifying each circuit or component of the wireless device to be included in the boundary scan chain.

The method may also include removing power from the processor, the non-persistent registers, the non-volatile memory, and one or more other portions of the wireless device during the low-power state. The method may also include returning to the active power state after a period of time and restoring the state information to the non-persistent registers using the one or more test signals upon returning to the active power state. In some instances, restoring the state information may also include routing the state information from the non-volatile memory to the non-persistent registers via the boundary scan chain using the one or more test signals.

The boundary scan chain may include at least the non-persistent registers, the non-volatile memory, and the processor. In some instances, the boundary scan chain may be based at least in part on the Joint Test Action Group (JTAG) standard, the one or more test signals include a Test Clock (TCK) and a Test Mode Signal (TMS), the state information is scanned into the non-persistent registers as Test Data In (TDI), and the state information is scanned out of the non-persistent registers as Test Data Out (TDO). In some instances, the boundary scan chain includes a number N of channels, and the method also includes obtaining the state information as a 3-input signal via TDI, TCK, and TMS pins of the wireless device, and converting the 3-input signal into N serial bitstreams for shifting through the N channels of the boundary scan chain.

Another innovative aspect of the subject matter described in this disclosure can be implemented in a wireless device. In some implementations, the wireless device includes a processor, a plurality of non-persistent registers, a non-volatile memory, a boundary scan chain, and a memory coupled to the processor. The plurality of non-persistent registers store state information associated with operations performed by the processor. The boundary scan chain may include at least a portion of the processor, the non-persistent registers, and the non-volatile memory. The memory stores instructions that, when executed by the processor, causes the wireless device to perform operations that include storing the state information in the non-persistent registers during an active power state. The operations also include routing, via the boundary scan chain using one or more test signals, the state information from the non-persistent registers to a non-volatile memory based on an indication that the wireless device is to enter a low-power state, and entering the low-power state after the state information is stored in the non-volatile memory.

In some instances, the non-volatile memory is a Static Random Access Memory (SRAM), and the operations may also include configuring at least a portion of the SRAM as a cache memory for the processor during the active power state. In some aspects, the state information includes all data stored in each general-purpose register and each architectural register associated with the processor. In other aspects, the state information includes configuration data identifying each circuit or component of the wireless device to be included in the boundary scan chain.

The operations may also include removing power from the processor, the non-persistent registers, the non-volatile memory, and one or more other portions of the wireless device during the low-power state. The operations may also include returning to the active power state after a period of time, and restoring the state information to the non-persistent registers using the one or more test signals upon returning to the active power state. In some instances, restoring the state information may also include routing the state information from the non-volatile memory to the non-persistent registers via the boundary scan chain using the one or more test signals.

The boundary scan chain may include at least the non-persistent registers, the non-volatile memory, and the processor. In some instances, the boundary scan chain may be based at least in part on the JTAG standard, the one or more test signals include TCK and TMS, the state information is scanned into the non-persistent registers as TDI, and the state information is scanned out of the non-persistent registers as Test Data Out TDO. In some instances, the boundary scan chain includes a number N of channels, and the operations also include obtaining the state information as a 3-input signal via TDI, TCK, and TMS pins of the wireless device, and converting the 3-input signal into N serial bitstreams for shifting through the N channels of the boundary scan chain.

Details of one or more implementations of the subject matter described in this disclosure are set forth in the accompanying drawings and the description herein. Other features, aspects, and advantages will become apparent from the description, the drawings, and the claims.

BRIEF DESCRIPTION OF THE DRAWINGS

Aspects of the present disclosure are illustrated by way of example and are not intended to be limited by the figures of the accompanying drawings.

Like reference numbers and designations in the various drawings indicate like elements.

DETAILED DESCRIPTION

Figure 1:
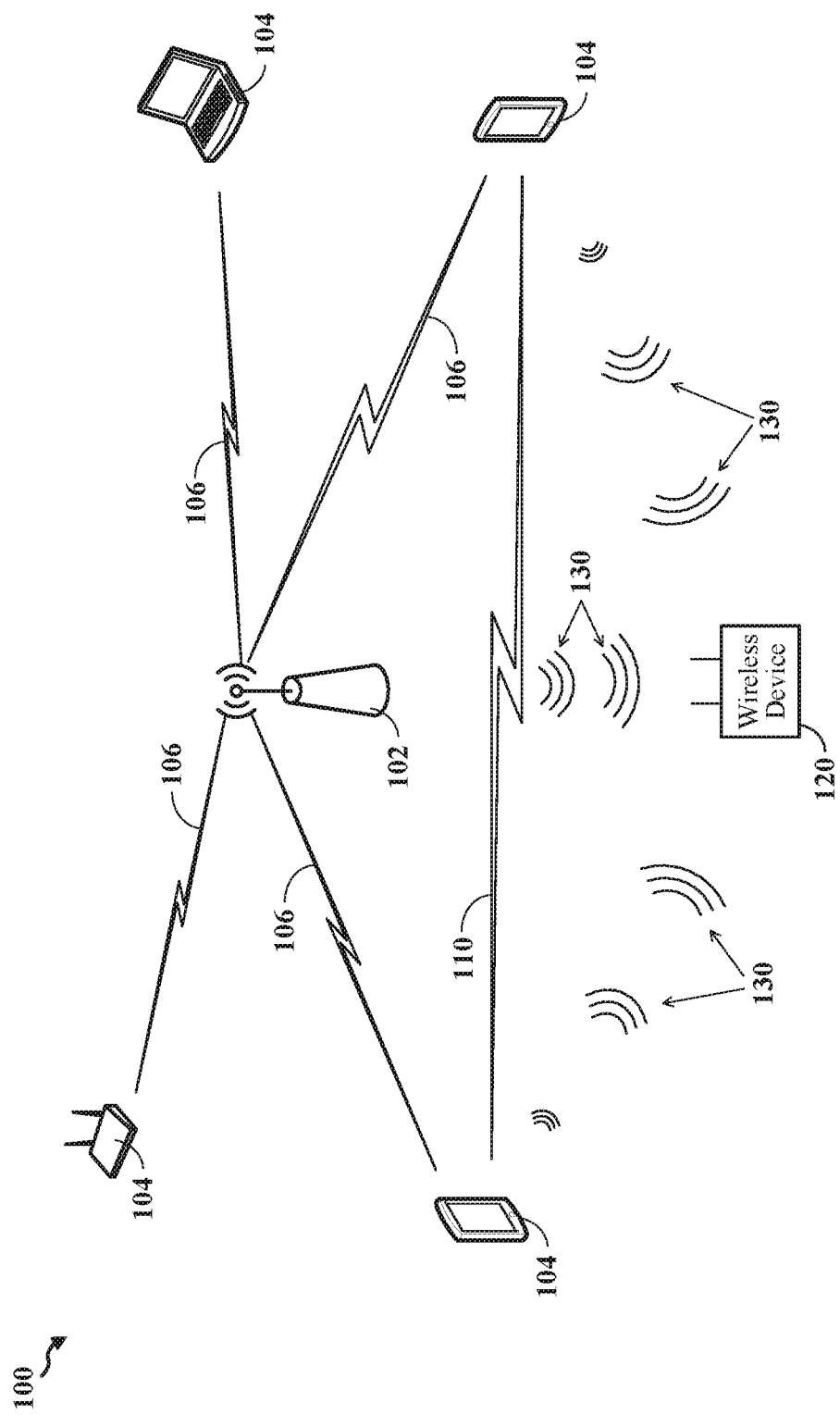
FIG. 1 shows a wireless communication system within which aspects of the present disclosure may be implemented.

The following description is directed to certain implementations for the purpose of describing innovative aspects of this disclosure. However, a person having ordinary skill in the art will readily recognize that the teachings herein can be applied in a multitude of different ways. The described implementations can be implemented in any device, system, or network that is capable of transmitting and receiving radio frequency (RF) signals according to one or more of the Institute of Electrical and Electronics Engineers (IEEE) 802.11 standards, the IEEE 802.15 standards, the Bluetooth® communication protocols defined by the Bluetooth Special Interest Group (SIG), or the Long Term Evolution (LTE) and Fifth Generation New Radio (5G NR) standards promulgated by the 3rd Generation Partnership Project (3GPP), among others. These RF signals may be transmitted or received using one or more of code division multiple access (CDMA), time division multiple access (TDMA), frequency division multiple access (FDMA), orthogonal FDMA (OFDMA), single-carrier FDMA (SC-FDMA), single-user (SU) multiple-input multiple-output (MIMO), and multi-user (MU) MIMO.

In accordance with various aspects of the disclosed herein, a wireless device may be able to transition between various power modes or states including (but not limited to) an active power state and a low-power state. For example, when processing, transmitting, or receiving data, the wireless device may be in the active power state during which most (if not all) components of the wireless device are powered-on and fully operational. During periods of inactivity, the wireless device may transition from the active power state to the low-power state to conserve power. In some instances, some components of the wireless device 200 may be powered-down or powered with a reduced supply voltage during the low-power state. In some other instances, all components of the wireless device 200 may be powered-down during the low-power state. State information stored in various non-persistent registers or latches of the wireless device 200 may be obtained and routed as a serial bitstream to an SRAM (or other suitable non-volatile memory) via a boundary scan chain before the wireless device 200 enters the low-power state, thereby preserving the operational state of the wireless device 200. The boundary scan chain, which may be compliant with the JTAG standard, includes at least the non-persistent registers, the SRAM, and the processor. When the wireless device exits the low-power state and enters the active power state, the saved state information may be read from the SRAM, routed as a serial bitstream to the non-persistent registers via the boundary scan chain, and thereafter restored to the non-persistent registers, thereby restoring the wireless device to its previous operational state.

In the following description, numerous specific details are set forth such as examples of specific components, circuits, and processes to provide a thorough understanding of the disclosure. The term "coupled" as used herein means coupled directly to or coupled through one or more intervening components or circuits. Also, in the following description and for purposes of explanation, specific nomenclature is set forth to provide a thorough understanding of the example embodiments. However, it will be apparent to one skilled in the art that these specific details may not be required to practice the example embodiments. In other instances, well-known circuits and devices are shown in block diagram form to avoid obscuring the disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all embodiments defined by the appended claims.

The various illustrative logical blocks, modules, circuits, and instructions described in connection with the implementations disclosed herein may be executed by one or more processors, such as one or more digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor" as used herein may refer to any of the foregoing structures or any other structure suitable for implementation of the techniques described herein. In addition, the functionality described herein may be provided within dedicated software modules or hardware modules configured as described herein. The techniques disclosed herein may be fully implemented in one or more circuits or logic elements.

FIG. 1 shows a wireless environment 100 within which aspects of the present disclosure may be implemented. The wireless environment 100 may include any number of wireless communication devices such as a base station 102, various client devices 104, and a wireless device 120. Although only one base station 102 is shown in the example of FIG. 1, in other implementations, the wireless environment 100 may include multiple base stations 102. Each of the client devices 104 also may be referred to as a wireless station (STA), a mobile station (MS), a mobile device, a mobile handset, a wireless handset, an access terminal (AT), a user equipment (UE), a subscriber station (SS), or a subscriber unit, among other examples. The client devices 104 may be various devices such as mobile phones, personal digital assistant (PDAs), other handheld devices, netbooks, notebook computers, tablet computers, laptops, display devices (for example, TVs, computer monitors, navigation systems, among others), music or other audio or stereo devices, remote control devices, printers, kitchen or other household appliances, key fobs (for example, for passive keyless entry and start (PKES) systems), among other examples.

In some implementations, the wireless environment 100 may be associated with a wireless local area network (WLAN) such as a Wi-Fi network that implements one or more of the IEEE 802.11 family of wireless communication standards or a cellular network that implements one or more of the 3GPP communication protocols. In other implementations, the wireless environment 100 may be associated with a mesh network operating according to the EasyMesh™ specification provided by the Wi-Fi Alliance or a wireless personal area network (WPAN) that implements one or more of the Bluetooth or Bluetooth Low Energy (BLE) Specifications. For these implementations, the client devices 104 can communicate with one another over direct communication links (such as BLE connections or mesh links), and the base station 102 may not be needed. In some other implementations, RF signals transmitted by base station 102 and client devices 104 may be based on proprietary, military, or other non-commercial communication standards.

The wireless device 120 includes an energy harvester that can convert energy associated with RF signals transmitted by base station 102, client devices 104, and other sources of electromagnetic radiation into power that can be used to power one or more components of the wireless device 120. In some instances, the wireless device 120 may include a battery and a small charge store device (such as a capacitor) that can store harvested energy for subsequent use in powering various components of the wireless device 120. In other instances, the wireless device 120 may not include a battery. For example, the wireless device 120 may be an IoT device including (but not limited to) an environmental sensor (such as a temperature sensor, air pressure sensor, or humidity sensor, among other examples), a door position sensor, a window position sensor, a door or building access card, or any wireless device for which a battery or external power source may not be feasible. In some aspects, the wireless device 120 may be powered entirely by energy harvested from RF signals and other sources of electromagnetic radiation.

Figure 2:
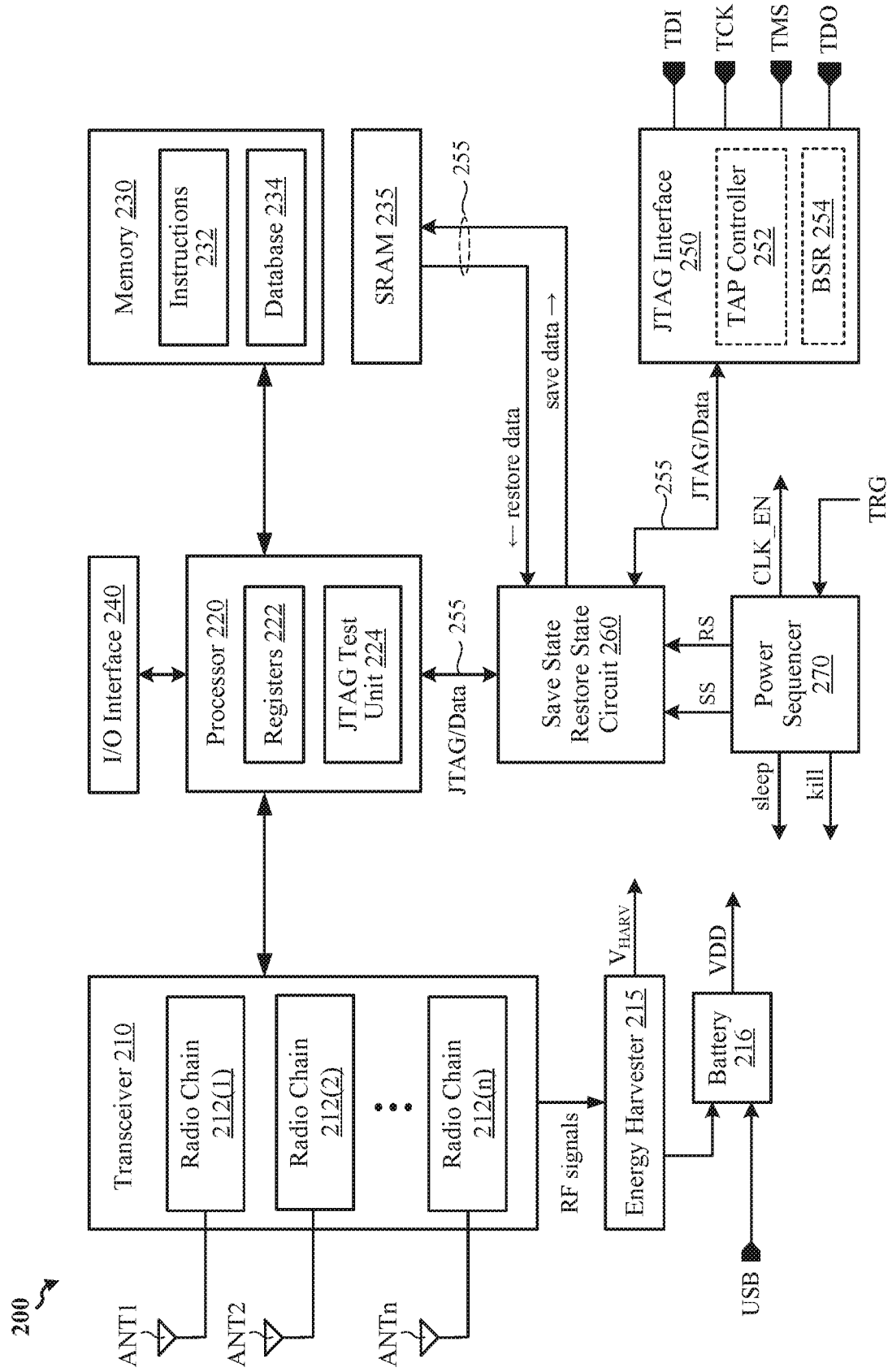
FIG. 2 shows a block diagram of an example wireless device, according to some aspects of the present disclosure.

FIG. 2 shows a block diagram of a wireless device 200 in accordance with various aspects of the present disclosure. In some implementations, the wireless device 200 may be an example of the wireless device 120 of FIG. 1. The wireless device 200 includes antennas ANT1-ANTn, a transceiver 210, an energy harvester 215, a processor 220, a memory 230, a Static Random Access Memory (SRAM) 235, an input/output (I/O) interface 240, a battery 216, a Joint Test Action Group (JTAG) interface 250, a Save State Restore State (SSRS) circuit 260, and a power sequencer 270.

The antennas ANT1-ANTn can transmit and receive RF signals of various frequencies to and from other wireless devices. For example, in some instances, the antennas ANT1-ANTn can transmit and receive RF signals in one or more of the 900 MHz frequency band, the 2.4 GHz frequency band, the 5 GHz frequency band, the 6 GHz frequency band, or the 60 GHz frequency band as Wi-Fi communications, Bluetooth communications, or cellular communications, among other examples. In some aspects, the RF signals may not be associated with any commercially available communication protocol (such as Wi-Fi and Bluetooth communication protocols), but instead may be based on a signaling technique independent of commercially available communication protocols (such as a proprietary or military communication protocol. In the example of FIG. 2, the wireless device 200 is shown to include multiple antennas ANT1-ANTn that can provide antenna diversity, enable multiple-input, multiple-output (MIMO) communications, and/or transmit or receive multiple spatial streams to or from other wireless devices. In other aspects, the wireless device 200 may include only one antenna.

The transceiver 210 may be coupled to the antennas ANT1-ANTn, either directly or through an antenna selection circuit (not shown for simplicity). The transceiver 210 may be used to transmit signals to and receive signals from other wireless devices such as (but not limited to) the base station 102 and the client devices 104 of FIG. 1. The transceiver 210 may also be used to scan the surrounding environment to detect and identify nearby wireless devices. The transceiver 210 may include a plurality of radio chains 212(1)-212(n) that can be used to communicate with other wireless devices according to one or more wireless communication protocols such as (but not limited to) WLAN communications, Bluetooth communications, or cellular communications. Although not shown in FIG. 2 for simplicity, each of the radio chains 212(1)-212(n) may include a transmit chain and a receive chain. Each transmit chain may receive data to be transmitted from the baseband processor 220, upconvert the received data from a baseband frequency to a carrier frequency (such as 2.4 GHz or 5 GHZ) and transmit the upconverted data to one or more other wireless devices via one or both antennas ANT1-ANTn. Each receive chain may receive data transmitted from other wireless devices via one or both antennas ANT1-ANTn, down-convert the received data from the carrier frequency to the baseband frequency and provide the down-converted data to the baseband processor 220. In some instances, the wireless device 200 may be configured for MIMO operations. The MIMO operations may include SU-MIMO operations and MU-MIMO operations. In some aspects, the wireless device 200 may also be configured for OFDMA communications or other suitable multiple access mechanisms.

In some implementations, the transceiver 210 may include a wake-up receiver (not shown for simplicity) configured to receive on-off keying (OOK) modulated RF signals. On-off keying uses the presence and absence of RF energy to encode data within the RF signal. For example, another wireless device may transmit an RF signal containing a relatively high amount of RF energy to indicate a first logical state (e.g., a logical one), and may transmit an RF signal containing a relatively low amount of RF energy to indicate a second logical state (e.g., a logical zero). The wake-up receiver can detect the energy level of an RF signal received from the other wireless device and determine the logical state indicated by the RF signal. A group of logical states indicated by such a signal can be used to identify and wake-up the wireless device 200. Although RF signals that convey information using an OOK mechanism can be modulated according to Wi-Fi, Bluetooth, BLE, or some other communication protocol, these RF signals can also use an unmodulated carrier signal within a frequency band from which the wake-up receiver is able to detect the presence (or absence) of RF energy. As such, the wake-up receiver does not need to demodulate received RF signals, but instead may receive and decode RF signals simply by detecting the presence or absence of RF energy on a wireless medium. In some aspects, the wake-up receiver may identify RF signals by correlating the detected RF energy with known energy patterns.

The energy harvester 215 can harvest energy from RF signals and other sources of electromagnetic radiation in a vicinity of the wireless device 200. The energy harvester 215 can convert the harvested energy into a harvested voltage ($V_{HARV}$) or a current that can power various components of the wireless device 200 via one or more suitable power rails (not shown for simplicity). In some aspects, the energy harvester 215 may also provide envelope information associated with received RF signals. The RF envelope information may indicate a magnitude, a power density, or other metric associated with the received RF signal. In addition, or in the alternative, the wireless device 200 may include a photovoltaic cell (not shown for simplicity) that can capture photovoltaic energy for use in charging and/or power-on operations of the wireless device 200.

The battery 216 may be any suitable battery or charge-storing device that can store an amount of charge sufficient to provide a supply voltage (VDD) to various components of the wireless device 200 via one or more power rails (not shown for simplicity). The battery 216 can be charged using an external USB power supply or the harvested energy $V_{HARV}$ provided by the energy harvester 215 (e.g., when the external USB power supply is not available). In some aspects, the battery 216 may be a lithium-ion battery or other type of lithium-based battery that provides a relatively high operating voltage (such as 4.6V). In other aspects, the battery 216 may be a low-voltage battery such as a nickel-cadmium "coin" battery that provides a relatively low operating voltage (such as 3.3V).

The processor 220 is coupled to the transceiver 210 via one or more signal lines, is coupled to the memory 230 via one or more signal lines, and is coupled to the I/O interface 240 via one or more signal lines. The processor 220 may also include ports that can exchange JTAG commands and data with the SSRS Circuit 260. The processor 220 may be used to process signals received from the memory 230 and to forward the processed signals to the transceiver 210 for transmission via one or more of the antennas ANT1-ANTn. The processor 220 may also be used to process signals received from one or more of the antennas ANT1-ANTn via the transceiver 210 and to forward the processed signals to the memory 230.

The processor 220 may be any suitable microprocessor capable of executing scripts or instructions 232 of one or more software programs stored in the wireless device 200 (e.g., within memory 230). For example, the processor 220 can execute instructions 232 to perform various operations associated with the wireless device 200 and format frames carrying data, commands, capabilities, parameters, and other information for transmission to one or more other wireless devices. The processor 220 can also execute the instructions 232 to control energy harvesting mechanisms associated with the wireless device 200. In various aspects, the processor 220 may be or may include one or more central processing units (CPUs) that provide microprocessor functionalities and providing at least a portion of machine-readable media. In some aspects, the processor 220 may be or may include one or more Application Specific Integrated Circuits (ASICs), FPGAs, or PLDs, among other examples.

In the example of FIG. 2, the processor 220 is shown to include a number of registers 222 and a JTAG test unit 224. Other well-known components of the processor 220 such as (but not limited to) CPU execution units, media access controllers (MACs), switch fabric, clock signals, memory controllers, and bus systems are not shown for simplicity. The registers 222 may represent a plurality of non-persistent registers, such as storage latches or DRAM cells, that store data and other information pertaining to operations performed or facilitated by the processor 222. For example, in some aspects, the non-persistent registers may include general-purpose registers, architectural registers, and/or configuration registers associated with a core logic of the processor 222. In other aspects, the non-persistent registers may be or represent any other register or storage element within or associated with the wireless device 200.

The JTAG test unit 224, which may be compliant with the IEEE 1149.1 standard, allows for basic JTAG chip testing and debug functionality of the aforementioned components of the wireless device 200 along with logic, registers, memory structures, and other circuits through an external controller (not shown for simplicity) coupled to the JTAG interface 250. For example, the JTAG test unit 224 can provide the external controller with read and write access to the registers 222, thereby allowing the external controller (or another circuit coupled to the JTAG interface 250) to scan data out of and scan data into the registers 222. The JTAG test unit 224 can also start and stop the microprocessor's core, step one or more instruction, freeze timers, enable and disable clock signals, and set hardware or software breakpoints, among other examples.

As described, the memory 230 can store instructions 232 for execution by the processor 220. The memory 230 may also include a database 234 that stores profile information for the wireless device 200 and/or profile information for other wireless devices. The database 234 may also store capabilities, parameters, and/or configuration information for the wireless device 200 and/or for other wireless devices. The memory 230 may also include a non-volatile memory 236 that can persistently store data and/or information even in the absence of VDD or $V_{HARV}$. In some instances, the instructions 232 may be stored in a non-transitory computer-readable medium within or associated with memory 230 and may be any suitable type of non-volatile memory including (but not limited to) EPROM, EEPROM, Flash memory, or a hard drive, among other examples.

The SRAM 235 may be any suitable SRAM that can retain state information stored therein in the absence of a supply voltage or power. For example, when power is removed from the SRAM 235 and other components of the wireless device 200 during the low-power state, state information can be retained in the SRAM 235 and thereafter restored to registers 222 when the wireless device 200 returns to the active power state. The SRAM 235 may be of a size that allows all data stored in the registers 222 to be saved and retained in the SRAM 235 during the low-power state. In this way, all state information associated with the wireless device 200 can be retained during the low-power state, which may provide a commercial advantage (as compared to wireless devices that can only retain some state information during low-power operation). Moreover, in some aspects, the SRAM 235 may be an existing memory resource of the wireless device 200 that can be configured as a dual-purpose memory: in one mode, the SRAM 235 can operate as memory associated with the processor 220 (e.g., as a cache memory), while in another mode, the SRAM 235 can operate as a retention memory that saves state information for the wireless device 200 during the low-power state. In other implementations, the SRAM 235 may be replaced by another suitable non-volatile memory.

The I/O interface 240 may include any suitable mechanism, interface, or device to receive input (such as commands) from the user and to provide output to the user. For example, the I/O interface 240 may include (but are not limited to) a graphical user interface, keyboard, mouse, microphone, speakers, and so on. Although not shown for simplicity, in some instances, the I/O interface 240 may also include a display upon which items may be presented to a user. In some aspects, the display may be a touch-screen display that allows the user to interact with various features, programs, and operations of the wireless device 200.

The JTAG interface 250, which may be compliant with the IEEE 1149.1 family of standards, allows various components of the wireless device 200 such as (but not limited to) internal registers, flip-flops, combinational logic, and signal lines, among other examples, to be included on a boundary scan chain 255 that can be used to test and/or debug the various components after fabrication of the wireless device 200. As shown in FIG. 2, the JTAG interface 250 may include a Test Access Port (TAP) controller 252 and a Boundary Scan Register (BSR) 254. The TAP controller 252 includes inputs coupled to a test clock (TCK) pin, a test mode select (TMS) pin, and a test data in (TDI) pin. The TAP controller 252 also includes an output coupled to a test data out (TDO) pin. Together, the TDI, TCK, TMS, and TDO pins form a well-known JTAG command set that can be used to scan data into and/or scan data out of registers 222 using the boundary scan chain 255.

For example, state information can be scanned out of the registers 222 and routed to the TDO pin of the JTAG interface 250 using the boundary scan chain 255 and the JTAG command set, and a serial bitstream that includes saved state information can be routed from the TDI pin of the JTAG interface 250 to the registers 222 using the boundary scan chain 255 and the JTAG command set. TCK may be used to clock or scan the bitstream through the boundary scan chain 255, and the TMS signal may be used to control the state of TAP controller 252. In the example of FIG. 2, the TAP controller 252 includes three additional outputs to provide the TCK, TDI, and TMS signals to the processor 220, and includes an additional input to receive TDO from the processor 220.

The boundary scan register 254 provides pin-level access to the processor 220 and can implement a serial scan path to route, intercept, and/or re-direct signals between various processor resources (such as registers 222) and I/O test pins of the wireless device 200. More specifically, the boundary scan register 254 can be used to shift state information scanned out from registers 222 as one or more serial bitstreams into SRAM 235 via one or more channels of the boundary scan chain 255 during save state operations and can shift state information scanned out from SRAM 235 as one or more serial bitstreams into registers 222 via the one or more channels of the boundary scan chain 255 during restore state operations. Although not shown for simplicity in FIG. 2, the JTAG interface 250 may also include a BYPASS register and an IDCODES register. The BYPASS register is a single-bit register that causes information to be passed directly from TDI to TDO, thereby allowing other components of the wireless device 200 to be tested with minimal overhead. The IDCODES register contains the ID code and revision number for the wireless device 200, which allows the wireless device 200 to be linked to its Boundary Scan Description Language (BSDL) file containing details of the boundary scan configuration.

The boundary scan chain 255, only a portion of which is shown in FIG. 2 for simplicity, may include any number of selected components of the wireless device 200 that are stitched together to form one or more serial scan paths through which test data and/or state information can be shifted or scanned through the selected components using the JTAG command set. In various aspects, the boundary scan chain 255 may include at least the non-persistent registers 222, the SRAM 235, and the processor 220. In some instances, the boundary scan chain 255 may include 32 serial paths or channels through which 32 corresponding serial bitstreams can be scanned or shifted, thereby allowing 32 bits of state information to be scanned out of registers 222 and into SRAM 235 per TCK cycle during save state operations and allowing 32 bits of state information to be scanned out of SRAM 235 and into registers 222 per TCK cycle during restore state operations. In other instances, the boundary scan chain 255 may include other numbers of serial paths or channels.

The SSRS circuit 260 includes inputs to receive Save State (SS) and Restore State (RS) signals from the power sequencer 270, includes one or more ports coupled to the processor 220 via boundary scan chain 255, and includes one or more ports coupled to the JTAG interface 250 via boundary scan chain 255. When the SS signal is asserted to indicate a save state operation, the SSRS circuit 260 can be used to scan state information out of registers 222, route the state information to SRAM 235 using the boundary scan chain 255, and store the scanned state information into SRAM 235. When the RS signal is asserted to indicate a restore state operation, the SSRS circuit 260 can be used to scan out state information saved in SRAM 235, route the state information to registers 222 using the boundary scan chain 255, and restore the state information to their original locations or addresses in registers 222.

The power sequencer 270 includes an input to receive a trigger signal TRG, outputs to provide the SS and RS signals to the SSRS circuit 260, outputs to provide sleep and kill signals, and an output to provide a clock enable signal CLK_EN. The power sequencer 270 can power-down various components of the wireless device 200 during the low-power state using the sleep and kill signals and can disable clock signals associated with the wireless device 200 during the low-power state using CLK_EN. The power sequencer 270 can also control save state and restore state operations using the SS signal and the RS signal, respectively.

For example, when the trigger signal TRG indicates that the wireless device 200 is about to enter the low-power state, the power sequencer 270 can assert the SS signal to initiate the save state operation which, as described above, allows the SSRS circuit 260 to read state information from the registers 222 and store the state information in SRAM 235. Then, when the wireless device 200 enters the low-power state, the power sequencer 270 can assert the sleep signal to remove power from one or more portions of the wireless device 200 or can assert the kill signal to remove power from all components of the wireless device 200, thereby reducing or even eliminating power consumption during the low-power state. The power sequencer 270 may also de-assert CLK_EN to disable all clock signals associated with the wireless device 200.

When the trigger signal TRG indicates that the wireless device 200 is returning to the active power state, the power sequencer 270 can assert the RS signal to initiate the restore state operation which, as described above, allows the SSRS circuit 260 to obtain the state information stored in SRAM 235 and restore the state information to registers 222. Upon returning to the active power state, the power sequencer 270 can de-assert the sleep signal and/or kill signal to restore power to the various components of the wireless device 200, thereby returning the wireless device 200 to a fully-powered operational state. The power sequencer 270 may also assert CLK_EN to enable all clock signals associated with the wireless device 200.

Although not shown for simplicity, the power sequencer 270 may also include an input to receive a configuration bitstream from memory 230 or SRAM 235. The configuration bitstream may include configuration data that may indicate the battery type, maximum operating voltage, charging procedures associated with the battery 216, the power states used by the wireless device 200, the conditions under which the wireless device 200 transitions between the power states, configuration of the boundary scan chain 255, components used to implement the boundary scan chain 255, and one or more parameters associated with the save state operation and the restore state operation, among other examples.

Figure 3:
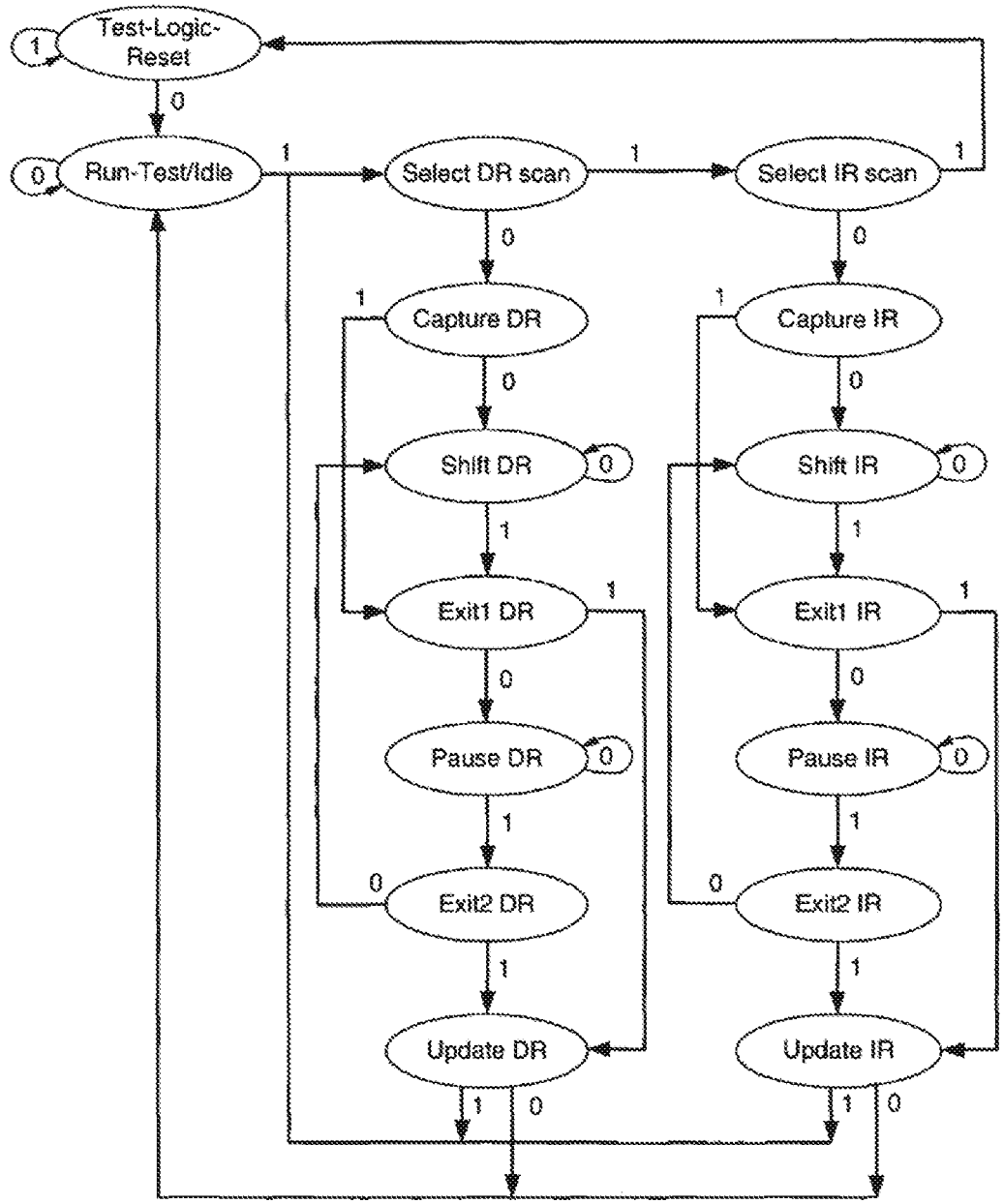
FIG. 3 shows a state diagram associated with the TAP controller of FIG. 2, according to some aspects of the present disclosure.

FIG. 3 shows a state diagram 300 that can be implemented by the TAP controller 252 of FIG. 2, according to some aspects of the present disclosure. The TAP controller 252 generates clock signals and control signals associated with the correct sequence of operations of the boundary scan register 254 and the processor's JTAG test unit 224. The control signals may be used to load instructions and associated data into the boundary scan register 254 and the processor's test unit 224, and can be used to perform one or more test actions including (but not limited to) capture, shift, and update test data. In various aspects, the TAP controller 252 may be used to configure various components of the wireless device 200 via the boundary scan register 254 and may also be used to access and/or control the internal resources of the processor 220 and memory 230 via the processor's JTAG test unit 224.

The TAP controller 252 is initialized to the Test-Logic-Reset state, and thereafter enters the Run-Test/Idle state when TMS is held low (e.g., TMS=0) for at least one TCK pulse. TAP controller 252 may be placed in the Run-Test/Idle state while program, erase, blank, and verify operations are performed on the various components of the wireless device 200. During test procedures, TAP controller 252 enters either a data register (DR) branch of the state diagram 300 or an instruction register (IR) branch of the state diagram 300.

When TAP controller 252 enters the DR branch of the state diagram 300, a selected data register in the boundary scan register 254 or a selected internal register within processor 220 is connected between TDI and TDO, for example, so that data can be loaded into the boundary scan register 254. The Capture-DR state is used to load data into the data register. The Shift-DR state is used to shift previously captured data toward the TDO connector in response to TCK pulses. The Exit1-DR state, Pause-DR state, and Exit2-DR state are used to switch between selected power states and to temporarily halt a shifting process. The TAP controller 252 remains in the Pause-DR state until TMS is held high (e.g., TMS=1), at which time it enters the Exit2-DR state. Then, the TAP controller 252 can either return to the Shift-DR state or can enter the Update-DR state. When the TAP controller 252 is in the Update-DR state, which may indicate that the scanning of state information from one or more internal registers to a non-volatile memory is completed. From the Update-DR state, TAP controller 252 either returns to the Run-Test/Idle state or to the Select-DR state. The IR branch of the state diagram 300 is used to load instructions into the boundary scan register 254 and/or the processor 220 for subsequent test data operations. The states of the IR branch are similar to the states of the DR branch and are therefore not discussed in further detail.

Figure 4:
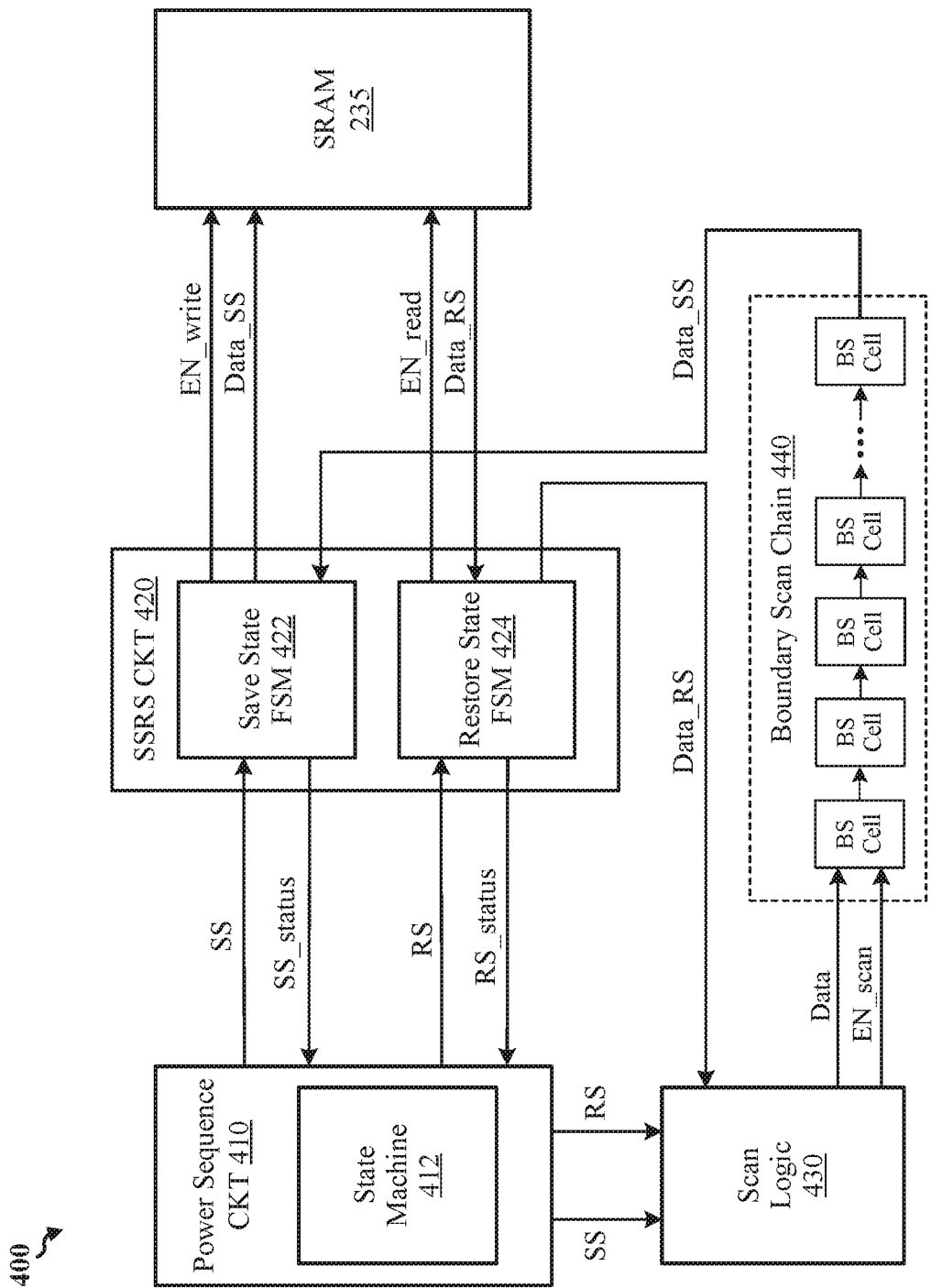
FIG. 4 shows a functional block diagram of a save state and restore state (SSRS) system that can be used in the wireless device of FIG. 2.

FIG. 4 shows a functional block diagram of a save state and restore state (SSRS) system 400 that can be used in the wireless device 200 of FIG. 2. The SSRS system 400 may be one implementation of the SSRS circuit 260 of FIG. 2. The SSRS system 400 may include a power sequencer circuit 410, a SSRS circuit 420, SRAM 235, scan logic 430, and a boundary scan chain 440. The power sequencer circuit 410, which may be one implementation of the power sequencer 260 of FIG. 2, includes a state machine 412 that selectively asserts the SS and RS signals based on a current and/or expected power state of the wireless device 200. The SS and RS signals are provided to the SSRS circuit 420 and the scan logic 430. The power sequencer circuit 410 also includes inputs to receive a save state status signal (SS_status) and a restore state status signal (RS_status) from the SSRS circuit 420.

The SSRS circuit 420, which may be one implementation of the SSRS circuit 260 of FIG. 2, includes a save state finite state machine (FSM) 422 and a restore state FSM 424. The save state FSM 422 includes an input to receive state information (Data_SS) from the boundary scan chain 440 to be saved in SRAM 235 during a save state operation, a first output to provide a write enable signal (EN_write) to SRAM 235 based on the SS signal, and a second output to provide Data_SS to SRAM 235 during the save state operation. The save state FSM 422 also includes an output to provide a save state status signal (SS_status) to the power sequencer circuit 410. The restore state FSM 424 includes an input to receive state information (Data_RS) from SRAM 235 to be restored to the registers 222 during a restore state operation, a first output to provide a read enable signal (EN_read) to SRAM 235 based on the RS signal, and a second output to provide Data_RS to the boundary scan chain 440 via the scan logic 430 during the restore state operation. The restore state FSM 424 also includes an output to provide a restore state status signal (RS_status) to the power sequencer circuit 410.

The scan logic 430 selectively asserts a scan enable signal (EN_scan) and shifts a data bitstream into the boundary scan chain 440 in response to the SS and RS signals. In various aspects, EN_scan may be based on TCK. In some instances, when the power sequencer circuit 410 asserts the SS signal to initiate a save state operation, scan logic 430 asserts EN_scan and shifts state information obtained from registers 222 by the JTAG test unit 224 as a serial bitstream into the boundary scan cells of the boundary scan chain 440. In some aspects, the boundary scan chain 440 provides the shifted serial bitstream to the save state FSM 422, which in turn provides the shifted serial bitstream to SRAM 235. The asserted SS signal may cause the save state FSM 422 to assert EN_write and save the state information within the serial bitstream into SRAM 235. The SS signal may be de-asserted upon completion of the save state operation.

When the power sequencer circuit 410 asserts the RS signal to initiate a restore state operation, scan logic 430 asserts EN_scan and shifts state information provided by the restore state FSM 424 as a serial bitstream into the boundary scan cells of the boundary scan chain 440. In some aspects, the boundary scan chain 440 provides the shifted serial bitstream to the JTAG test unit 224, which in turn restores the state information carried in the serial bitstream to the registers 222. The asserted RS signal may cause the restore FSM 424 to assert EN_read and obtain the saved state information from SRAM 235. The RS signal may be de-asserted upon completion of the restore state operation. Scan logic 430 may de-assert EN_scan when neither of the SS or RS signals are asserted, for example, when the wireless device 200 operates in the active power state.

The boundary scan chain 440, which may be one implementation of the boundary scan chain 255 of FIG. 2, is shown to include a plurality of boundary scan cells into which a serial bitstream can be shifted from scan logic 430 and out of which the serial bitstream can be shifted to the SSRS circuit 420. The boundary scan cells may represent various components of the wireless device 200 that have been selected and/or configured to form the boundary scan chain 440. In some instances, the boundary scan cells may include at least the registers 222, the SRAM 235, and the processor 220. Further, although the boundary scan chain 440 is shown to include only one channel (e.g., only one instance of the serially connected boundary scan cells), in other implementations, the boundary scan chain 440 may include multiple channels (e.g., multiple instances of the serially connected boundary scan cells). In various aspects, the boundary scan chain 440 may include 32 channels implemented as 32 instances of the serially connected boundary scan cells.

Although not shown for simplicity, the boundary scan chain 440 may employ a suitable compression scan technique to reduce the size of serial bitstreams that propagate through the boundary scan chain 440. In various aspects, the compression ratio may be based on the number of channels associated with the boundary scan chain 440. For example, for instances in which the boundary scan chain 440 includes 32 channels that can simultaneously shift 32 serial bitstreams to or from the registers 222, the compression scan technique may use a compression ratio of 32 and may be configured to convert a 3-signal input provided at the TDI, TCK, and TMS pins into a 32-bit signal that can be shifted along 32 corresponding channels of the boundary scan chain 440.

Figure 5:
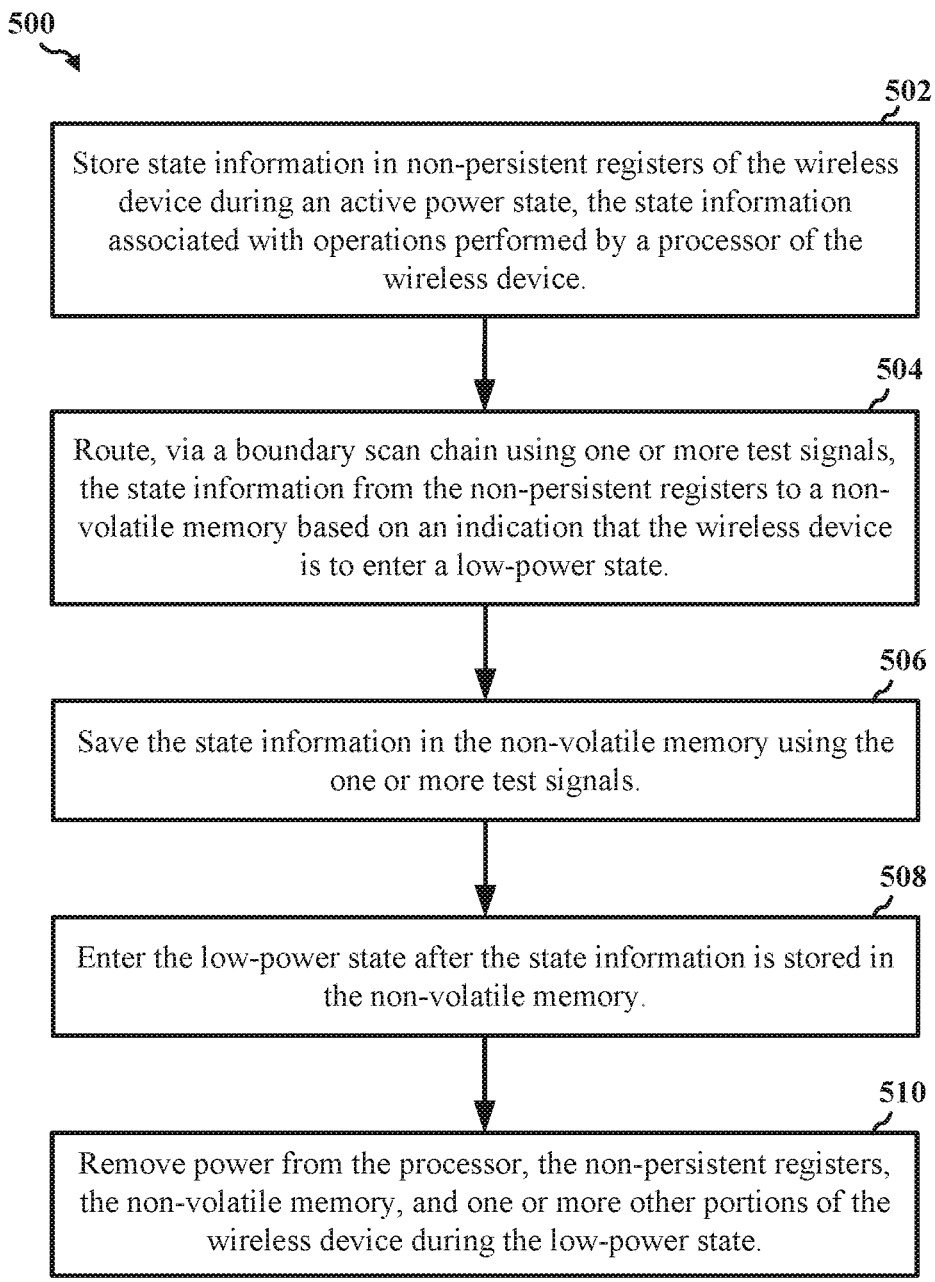
FIG. 5 shows a flow chart depicting an example operation for saving state information of a wireless device, according to some implementations.

FIG. 5 shows a flowchart illustrating an example operation 500 of operating a wireless device, according to various aspects of the present disclosure. In some implementations, the operation 500 may be performed by the wireless device 200 of FIG. 2. In various aspects, one or more portions of the operation 500 may be performed by a wireless device implementing the SSRS system 400 described with respect to FIG. 4. In some instances, the operation 500 begins at 502 with the wireless device 200 storing state information in non-persistent registers during an active power state, the state information associated with operations performed by a processor of the wireless device. At 504, the wireless device 200 routes, via a boundary scan chain using one or more test signals, the state information from the non-persistent registers to a non-volatile memory based on an indication that the wireless device 200 is to enter a low-power state. In some aspects, the boundary scan chain includes at least the non-persistent registers, the non-volatile memory, and the processor. At 506, the wireless device 200 saves the state information in the non-volatile memory using the one or more test signals. At 508, the wireless device 200 enters the low-power state after the state information is stored in the non-volatile memory. At 510, the wireless device 200 removes power from the processor, the non-persistent registers, the non-volatile memory, and one or more other portions of the wireless device during the low-power state.

The boundary scan chain may include at least the non-persistent registers, the non-volatile memory, and the processor. The boundary scan chain may be based at least in part on the Joint Test Action Group (JTAG) standard, and the one or more test signals may include a Test Clock (TCK) and a Test Mode Signal (TMS). In some aspects, the state information includes all data stored in each general-purpose register and each architectural register associated with the processor. In other aspects, the state information includes configuration data stored in one or more configuration registers of the wireless device. The configuration data may include a list identifying each circuit or component of the wireless device to be included in the boundary scan chain. The boundary scan chain may be based at least in part on the JTAG standard, and the one or more test signals include a Test Clock (TCK) and a Test Mode Signal (TMS).

Figure 6:
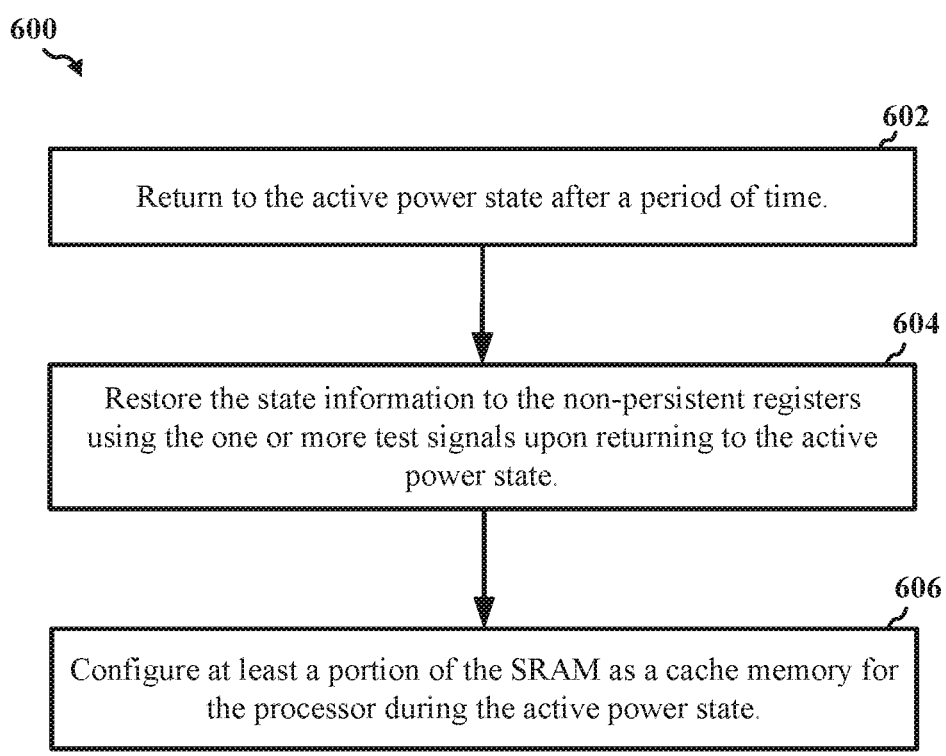
FIG. 6 shows a flow chart depicting an example operation for restoring state information of a wireless device, according to some implementations.

FIG. 6 shows a flowchart illustrating another example operation 600 of operating a wireless device, according to various aspects of the present disclosure. In some implementations, the operation 600 may be performed by the wireless device 200 of FIG. 2. In various aspects, one or more portions of the operation 600 may be performed by a wireless device implementing the SSRS system 400 described with respect to FIG. 4. In some instances, the operation 600 may be performed after the operation 500 of FIG. 5.

For example, at 602, the wireless device 200 returns to the active power state after a period of time. At 604, the wireless device 200 restores the state information to the non-persistent registers using the one or more test signals upon returning to the active power state. In some implementations, the state information is scanned into the non-persistent registers as Test Data In (TDI), and the state information is scanned out of the non-persistent registers as Test Data Out (TDO). In various aspects, the non-volatile memory is an SRAM, and the operation 600 continues at 606 with the wireless device 200 configuring at least a portion of the SRAM as a cache memory for the processor during the active power state.

In various aspects, the boundary scan chain is based at least in part on the Joint Test Action Group (JTAG) standard, the one or more test signals include a Test Clock (TCK) and a Test Mode Signal (TMS), the state information is scanned into the non-persistent registers as Test Data In (TDI), and the state information is scanned out of the non-persistent registers as Test Data Out (TDO). In some instances, the boundary scan chain includes a number N of channels, and the operation also includes obtaining the state information as a 3-input signal via TDI, TCK, and TMS pins of the wireless device, and converting the 3-input signal into N serial bitstreams for shifting through the N channels of the boundary scan chain.

As used herein, a phrase referring to "at least one of" or "one or more of" a list of items refers to any combination of those items, including single members. For example, "at least one of: a, b, or c" is intended to cover the possibilities of: a only, b only, c only, a combination of a and b, a combination of a and c, a combination of b and c, and a combination of a and b and c. As used herein, "based on" is intended to be interpreted in the inclusive sense, unless otherwise explicitly indicated. For example, "based on" may be used interchangeably with "based at least in part on," unless otherwise explicitly indicated. Specifically, unless a phrase refers to "based on only 'a,'" or the equivalent in context, whatever it is that is "based on 'a,'" or "based at least in part on 'a,'" may be based on "a" alone or based on a combination of "a" and one or more other factors, conditions, or information.

The various illustrative components, logic, logical blocks, modules, circuits, operations, and algorithm processes described in connection with the implementations disclosed herein may be implemented as electronic hardware, firmware, software, or combinations of hardware, firmware, or software, including the structures disclosed in this specification and the structural equivalents thereof. The interchangeability of hardware, firmware and software has been described generally, in terms of functionality, and illustrated in the various illustrative components, blocks, modules, circuits and processes described herein. Whether such functionality is implemented in hardware, firmware or software depends upon the application and design constraints imposed on the overall system.

Various modifications to the implementations described in this disclosure may be readily apparent to persons having ordinary skill in the art, and the generic principles defined herein may be applied to other implementations without departing from the spirit or scope of this disclosure. Thus, the claims are not intended to be limited to the implementations shown herein but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described herein as acting combinations, and even initially claimed as such, one or more features from a claimed combination can in some instances be excised from the combination, and the claimed combination may be directed to a subcombination or variation of a subcombination.

Similarly, while operations are depicted in the drawings in a particular order, this should not be understood as requiring that such operations be performed in the order shown or in sequential order, or that all illustrated operations be performed, to achieve desirable results. Further, the drawings may schematically depict one or more example operations in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described herein should not be understood as requiring such separation in all implementations, and the described program components and systems can generally be integrated together in a single software product or packaged into multiple software products.

What is claimed is:

1. A method of saving and restoring state information of a wireless device, the method comprising:
   storing state information in non-persistent registers of the wireless device during an active power state, the state information associated with operations performed by a processor of the wireless device;
   routing, via a boundary scan chain using one or more test signals, the state information from the non-persistent registers to a non-volatile memory based on an indication that the wireless device is to enter a low-power state;
   saving the state information in the non-volatile memory using the one or more test signals; and
   entering the low-power state after the state information is stored in the non-volatile memory.

2. The method of claim 1, wherein the state information includes all data stored in each general-purpose register and each architectural register associated with the processor.

3. The method of claim 1, wherein the state information includes configuration data identifying each circuit or component of the wireless device to be included in the boundary scan chain.

4. The method of claim 1, wherein the boundary scan chain includes at least the non-persistent registers, the non-volatile memory, and the processor.

5. The method of claim 1, further comprising:
   removing power from the processor, the non-persistent registers, the non-volatile memory, and one or more other portions of the wireless device during the low-power state.

6. The method of claim 5, further comprising:
   returning to the active power state after a period of time; and
   restoring the state information to the non-persistent registers using the one or more test signals upon returning to the active power state.

7. The method of claim 6, wherein restoring the state information includes routing the state information from the non-volatile memory to the non-persistent registers via the boundary scan chain using the one or more test signals.

8. The method of claim 7, wherein the boundary scan chain is based at least in part on the Joint Test Action Group (JTAG) standard, the one or more test signals include a Test Clock (TCK) and a Test Mode Signal (TMS), the state information is scanned into the non-persistent registers as Test Data In (TDI), and the state information is scanned out of the non-persistent registers as Test Data Out (TDO).

9. The method of claim 8, wherein the boundary scan chain includes a number N of channels, and the method further includes:
  obtaining the state information as a 3-input signal via TDI, TCK, and TMS pins of the wireless device; and
  converting the 3-input signal into N serial bitstreams for shifting through the N channels of the boundary scan chain.

10. The method of claim 1, wherein the non-volatile memory comprises a Static Random Access Memory (SRAM), and the method further comprises configuring at least a portion of the SRAM as a cache memory for the processor during the active power state.

11. A wireless device, comprising:
  a processor;
  a plurality of non-persistent registers configured to state information associated with operations performed by the processor;
  a non-volatile memory;
  a boundary scan chain; and
  a memory coupled to the processor and storing instructions that, when executed by the processor, causes the wireless device to perform operations including:
    storing state information in the plurality of non-persistent registers during an active power state;
    routing, via the boundary scan chain using the one or more test signals, the state information from the non-persistent registers to the non-volatile memory based on an indication that the wireless device is to enter a low-power state;
    storing the state information in the non-volatile memory using the one or more test signals; and
    entering the low-power state after the state information is stored in the non-volatile memory.

12. The wireless device of claim 11, wherein the state information includes all data stored in each general-purpose register and each architectural register associated with the processor.

13. The wireless device of claim 11, wherein the state information includes configuration data identifying each circuit or component of the wireless device to be included in the boundary scan chain.

14. The wireless device of claim 11, wherein the boundary scan chain includes at least the non-persistent registers, the non-volatile memory, and the processor.

15. The wireless device of claim 11, wherein execution of the instructions causes the wireless device to perform operations further including:
  removing power from the processor, the non-persistent registers, the non-volatile memory, and one or more other portions of the wireless device during the low-power state.

16. The wireless device of claim 15, wherein execution of the instructions causes the wireless device to perform operations further including:
  returning to the active power state after a period of time; and
  restoring the state information to the non-persistent registers using the one or more test signals upon returning to the active power state.

17. The wireless device of claim 16, wherein restoring the state information includes routing the state information from the non-volatile memory to the non-persistent registers via the boundary scan chain using the one or more test signals.

18. The wireless device of claim 17, wherein the boundary scan chain is based at least in part on the Joint Test Action Group (JTAG) standard, the one or more test signals include a Test Clock (TCK) and a Test Mode Signal (TMS), the state information is scanned into the non-persistent registers as Test Data In (TDI), and the state information is scanned out of the non-persistent registers as Test Data Out (TDO).

19. The wireless device of claim 18, wherein the boundary scan chain includes a number N of channels, and execution of the instructions causes the wireless device to perform operations further including:
  obtaining the state information as a 3-input signal via TDI, TCK, and TMS pins of the wireless device; and
  converting the 3-input signal into N serial bitstreams for shifting through the N channels of the boundary scan chain.

20. The wireless device of claim 11, wherein the non-volatile memory comprises a Static Random Access Memory (SRAM), and execution of the instructions causes the wireless device to perform operations further including configuring at least a portion of the SRAM as a cache memory for the processor during the active power state.

* * * * *